United States Patent

Nakagawa et al.

[15] 3,670,213

[45] June 13, 1972

[54] SEMICONDUCTOR PHOTOSENSITIVE DEVICE WITH A RARE EARTH OXIDE COMPOUND FORMING A RECTIFYING JUNCTION

[72] Inventors: Takashi Nakagawa; Tadashi Tsutsumi, both of Tokyo; Hiroo Hori, Kawasaki, all of Japan

[73] Assignee: Tokyo Shibaura Electric Co., Ltd., Kawasaki-shi, Japan

[22] Filed: May 21, 1970

[21] Appl. No.: 39,381

[30] Foreign Application Priority Data

May 24, 1969 Japan....................................44/39883
June 17, 1969 Japan....................................44/47325

[52] U.S. Cl. ................317/234 R, 317/235 UA, 317/235 N, 317/235 NA, 317/234 T, 317/235 AC, 317/238

[51] Int. Cl. ............................................................H01l 15/00

[58] Field of Search..........317/238, 235 UA, 234 T, 235 AC, 317/235 AQ, 237, 235 AT, 235 N, 235

[56] References Cited

UNITED STATES PATENTS 3,478,214 11/1969 Dillman....................................250/211
3,261,726 7/1966 Ruehwein..................................148/33.4
3,467,880 9/1969 Crowell......................................315/11

OTHER PUBLICATIONS

Ames et al., I.B.M. Technical Disclosure Bulletin, Vol. 9, No. 10 1967, pp. 1,470–1,471,

*Primary Examiner*—John W. Huckert
*Assistant Examiner*—Martin H. Edlow
*Attorney*—Flynn & Frishauf

[57] ABSTRACT

A semiconductor device comprising a substrate made of semiconductor materials such as silicon, germanium and compounds of the elements of Groups III–V, and at least one layer defining at least one junction therewith, said layer being made of a mixture of a rare earth element and titanium oxide and/or zirconium oxide.

7 Claims, 6 Drawing Figures

SEMICONDUCTOR PHOTOSENSITIVE DEVICE WITH A RARE EARTH OXIDE COMPOUND FORMING A RECTIFYING JUNCTION

The present invention relates to a semiconductor photosensitive device having a hetero-junction. The known junctions of a semiconductor device comprise a homotype formed by the same material and a heterotype formed by different materials. A semiconductor device having the former junction shows excellent rectifying and reverse withstand voltage characteristics, but has such a drawback that its manufacturing process is complicated and moreover requires a precise control during said process to obtain a good junction. On the other hand, the semiconductor device having the latter junction can be easily produced, but does not exhibit so good rectifying and reverse withstand voltage characteristics as desired.

The present invention has been developed to eliminate the above-mentioned drawbacks encountered with said two kinds of semiconductor devices. The semiconductor device of the present invention used the hetero-junction, permits easy manufacture and it exhibits excellent rectifying and reverse withstand voltage characteristics. With the device according to the present invention, the materials of a semiconductor substrate and the layers deposited on said substrate to define junctions therewith are limited to those given below. For the aforesaid substrate are adopted such semiconductor materials as silicon, germanium or compounds of Groups III–V. The junction-forming materials are selected from the group consisting of mixtures comprising oxides of rare earth elements and at least one of titanium oxide and zirconium oxide.

This invention can be more fully understood from the following detailed description when taken in connection with reference to the accompanying drawings, in which.

This invention is a semiconductor device wherein the substrate is made of silicon, germanium or the compounds of Groups III–V and there is deposited on one side of the substrate a layer made of oxides of rare earth elements such as yttrium oxide ($Y_2O_3$), dysprosium oxide ($Dy_2O_3$) and europium oxide ($Eu_2O_3$), with at least one of the group consisting of titanium oxide and zirconium oxide, thereby forming a junction having a rectifying property between the substrate and layer.

Figure 1:
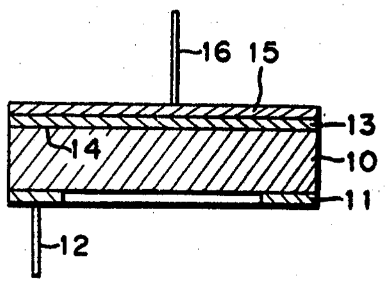
FIG. 1 is a sectional view of a semiconductor device, particularly a diode according to an embodiment of the present invention.

Referring to FIG. 1, there is first provided an N type silicon substrate 10 with a polished and cleaned surface having a diameter of 0.4 mm and a resistivity of 10 Ω-cm. On one side of the substrate is deposited gold by vacuum evaporation to form a metal layer 11 and then a lead wire 12 is bonded thereon. The resultant substrate 10 is fitted to the specified part of a vacuum evaporation apparatus, in a copper crucible in which there is provided a chalcogenide of zinc as pure as about 99.999 percent, for example, zinc sulfide as an evaporation source. The evaporation source is heated approximately to 1,000° C. and the evaporation device is kept in vacuum to 1 $\times 10^{-6}$ mm Hg so that the zinc sulfide is deposited about 1,000 A thick on the other side of the substrate 10 to form a layer 13. As a result, there is formed a junction 14 between the substrate 10 and layer 13. On the zinc sulfide layer 13 there is directly deposited aluminum as a metal electrode 15 by vacuum evaporation, and on the metal electrode 15 is bonded lead wire 16. Thus is prepared a semiconductor device shown in FIG. 1.

In general, the aforementioned zinc chalcogenides preferably are of as high purity as about 99.99 percent. These materials may be deposited either by the ordinary vacuum deposition process or electron-beam heating.

Said deposition may be carried out after the side of the semiconductor substrate is in advance masked in a desired pattern so as to selectively deposit the compounds thereon, or first forming a layer of the compounds all over one side of the substrate and then selectively removing the layer by photo-etching so as to allow it to assume a desired pattern. The last two methods are very convenient when forming a large number of semiconductor devices from a single wafer or when forming a semiconductor integrated circuit.

In the aforementioned embodiment, there is formed the junction by the layer made of zinc chalcogenides. However, a similar effect, as described later, can be obtained by forming a layer of a mixture of oxides of rare earth elements and titanium oxide and/or zirconium oxide. There will now be described an example of a semiconductor device involving the aforesaid layer. Oxides of rare earth elements, such as $Y_2O_3$, $Dy_2O_3$, $Eu_2O_3$ and $TiO_2$ and/or $ZrO_2$ are first mixed and heated to about 1,300° C. to form a source of materials to be vacuum deposited. This source is received, as in the aforementioned embodiment, in a vacuum deposition device together with the semiconductor substrate. The mixture is made to settle on the surface of the substrate to form a composition layer, thus defining a junction between the substrate and layer. This composition has a property electrically approximating that of an insulator.

While the proportions of the components involved in the aforementioned mixture are not subject to any particular limitation, those of $TiO_2$ and/or $ZrO_2$ are generally preferred to fall within the range of 50 to 90 mol %. Where the amount of oxides of rare earth elements is larger than that which falls within said range, then a layer formed of said mixture will have an increased insulation so that the current flowing through a semiconductor device involving said layer will present less favorable leading characteristics. Conversely, if the content of oxides of rare earth elements decreases from the level which corresponds to the aforesaid range, then it is likely that the insulating effect of the layer will fall with the result that the reversing property of the semiconductor device will be reduced.

In this embodiment, there are fitted, as in the preceding embodiment, separate electrode lead wires to make up a semiconductor device.

A semiconductor device or diode arranged as described above can be more easily manufactured than the conventional PN junction type diode. The prior art diode, whether prepared by the alloying or diffusion process, presented considerable difficulties in controlling the temperature and time required for such process, leading to low yield, whereas the diode of the present invention is fabricated simply by attaching prescribed materials to the surface of a substrate by an ordinary vapor deposition process, enabling the required temperature and time to be controlled with great ease, so that the diode can be produced in good yield.

Figure 2:
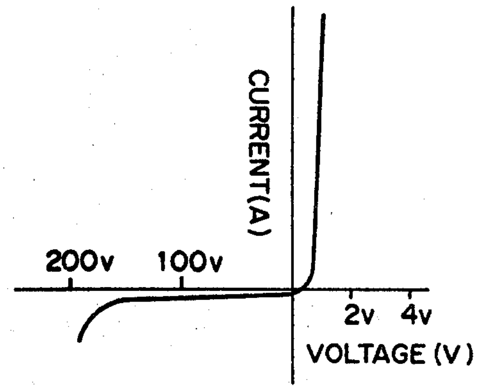
FIG. 2 is a curve diagram showing the rectifying property of the semiconductor device of FIG. 1.

The diode of the present invention displays far more excellent rectifying and reverse withstand voltage properties than the conventional hetero-junction type diode. There will now be described with reference to FIG. 2 an illustration of these properties. The curve of this figure presents the voltage-current characteristics of that type of diodes according to the present invention which is prepared by depositing a layer comprising a mixture of 20 mol % $Y_2O_3$ and 80 % $TiO_2$ on a silicon substrate of N type conductivity having a specific resistance of 10 Ω-cm. As apparent from FIG. 2, the above-mentioned diode has a good rectifying property, namely, allows the reverse withstand voltage to have a large ratio to the leading voltage, said withstand voltage having a substantially large value.

There have been described the semiconductor devices of the present invention particularly with those whose substrate consisted of silicon, germanium and III–V compound semiconductor. However, it will be apparent that there may be used instead a light-transmissible insulating substrate, prepared, for example, by vapor depositing the aforementioned semiconductor materials on a sapphire base.

Figure 3:
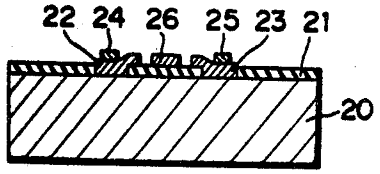
FIG. 3 is a sectional view of a semiconductor device, particularly a transistor according to another embodiment of the invention.

The semiconductor materials of the present invention are applicable not only to the above-mentioned diode, but also other semiconductor devices, for example, a transistor in which there are formed junctions. There will now be described by reference to FIG. 3 an illustration of such semiconductor device.

Numeral 20 denotes an N type silicon substrate having a specific resistance of about 10 Ω-cm. On the substrate 20 is deposited an insulation layer 21 of silicon dioxide. In this insulation layer are formed two parallel narrow openings spaced from each other.

Through these openings are deposited, for example, by vacuum evaporation on the substrate 20 two layers 22 and 23 each consisting of a mixture of $TiO_2$ and $Y_2O_3$ to define junctions with the substrate which are designated as a source layer 22 and a drain layer 23 respectively. On these source and drain layers 22 and 23 are formed a source electrode 24 and a drain electrode 25 respectively. To part of a silicon dioxide layer positioned between the layers 22 and 23 is fitted a gate electrode 26 to constitute an MOS type FET. Even with this FET, it is unnecessary to form the source and drain regions by diffusion as has been required in the prior art, thus prominently simplifying its manufacture.

As mentioned above, the semiconductor device of the present invention permits a semiconductor substrate and evaporation materials to be selected in wide variety. There will now be described some concrete examples. Where the semiconductor substrate consists of materials of Groups III–V such as silicon, germanium or gallium arsenide an evaporation material may be prepared from a mixture of $TiO_2$ and/or $ZrO_2$ plus at least one kind selected from the group consisting of $Y_2O_3$, $Eu_2O_3$, $Dy_2O_3$, $Sc_2O_3$ and $Sm_2O_2$.

Figure 5:
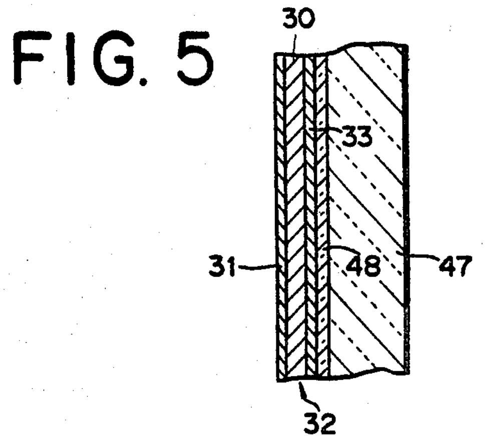
FIG. 5 is a schematic sectional view of an image pickup shown in FIG. 4.

The semiconductor device of the present invention is most adapted for use as the target of an image pickup tube due to its high sensitivity to light. There will now be described an example with reference to FIGS. 4 and 5. There was first provided a silicon substrate 30 of N type conductivity 150 microns thick, 20 mm in diameter and 15 Ω-cm in specific resistivity. One side of the substrate 30 was mirror polished and the other side was etched by a solution of a fluoro-nitric system to reduce the thickness to 20 microns. On the mirror polished surface of the substrate 30 is deposited by electron beam heating a composite layer 31 consisting of 20 mol % of yttrium oxide and 80 mol % titanium oxide to a thickness of 2,000 A. Thus was obtained a photo-electric converting target 32 consisting of an N type silicon substrate and the composite layer $10^{11}$ Ω-cm in specific resistivity which was prepared from yttrium oxide and titanium oxide. To make the target very sensitive to light particularly having short waves, it is only required, for example, to diffuse phosphorus in the substrate from the etched side thereof so as to form in advance a layer 33 of $N^+$ conductivity on said side.

Figure 4:
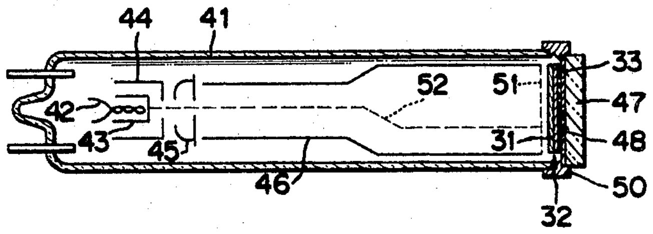
FIG. 4 is a schematic sectional view of an image pickup tube, the target of which consists of the semiconductor device of the invention.

There will now be described the manner in which there is assembled an image pickup tube using said photo-electric converting target 32. Starting with one side of an evacuated envelope 41 are coaxially arranged a heater 42, cathode 43 and first, second and third cylindrical grid electrodes 44, 45 and 46 in the order mentioned. The other end of the evacuated envelope 41 is sealed with a transparent glass plate 47 used as a face plate. To the inside of the transparent glass plate 47 is fitted the photo-electric converting device 32 in the following manner. On the inner surface of the transparent glass plate 47 is integrally formed a transparent conductive layer 48, on which there is bonded by a conductive paint the N type silicon semiconductor layer 49 of the photo-electric converting device 32. Referring to FIG. 4, numeral 50 represents a metal ring electrically connected to the transparent conductive layer 48, and numeral 51 a mesh electrode. The surface of a yttrium oxide-titanium oxide composite layer is scanned by electron beams 52 emitted from the cathode 43. This scanning causes electrical signals to be drawn out of the metal ring 50 through the transparent conductive layer 48.

When the cathode 43 of an image pickup tube thus prepared is set at a zero potential and the transparent conductive layer 48 at a positive potential, then the target will have a reverse bias and be reduced in dark current to become more sensitive. In this case, a given point on the yttrium oxide-titanium oxide composite layer of the photo-electric converting device is reduced to a zero potential when scanned by electron beams, but the holes excited by the light brought to the N type silicon substrate reach the surface of the composite layer, on which there occurs a rise of potential amounting to several volts according to the intensity of light received up to the point of time at which the surface is scanned next time by electron beams for one-thirtieth second. Said scanning draws out signals from the aforesaid given point on the composite layer.

Figure 6:
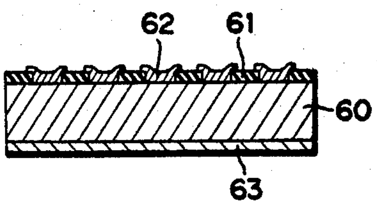
FIG. 6 is a sectional view of a target modified from FIG. 5.

With the above-mentioned image pickup tube, the target is very easy to make and displays good resolution and sensitivity. To cause the target to increase the degree of its resolution, it is advisable to prepare the target in the following manner. Referring to FIG. 6, one side of an N type silicon substrate is coated with a silicon dioxide layer 61, which is perforated with a large number of through holes in mosaic pattern by selective photo-etching. On those parts of the substrate surface which were exposed by the holes are deposited many composite layers 62 consisting of yttrium oxide and titanium oxide. On the underside of the substrate 60 is formed an $N^+$ type layer 63.

The aforesaid photo-electric converting device is applicable not only to an image pickup tube, but also to a high sensitivity dark field tube. The reason is that when the surface of the semiconductor layer of a photo-electric converting device according to the present invention is impinged with photons accelerated at a voltage of more than 10 KV in place of light, then the photons enter the semiconductor layer to a depth of several microns from the surface to generate a large number of electrons and holes around that depth, so that even where there is brought a slight amount of light from a foreground subject to the surface from which there are emitted photons, there can be obtained prominently multiplied image signals.

What we claim is:

1. A semiconductor photo sensitive device comprising a substrate made of semiconductor material and at least one layer on the substrate to define at least one rectifying junction therewith, said layer consisting essentially of a mixture of a rare earth oxide and at least one compound selected from the group consisting of (i) titanium oxide, and (ii) zirconium oxide.

2. The device of claim 1 wherein said rare earth oxide is selected from the group consisting of yttrium oxide, europium oxide, dysprosium oxide, scandium oxide and samarium oxide and wherein said compound is titanium oxide.

3. The device of claim 2 wherein said layer is over one side of said substrate, and at least on electrodes is in contact with the said layer and the other side of the substrate, respectively.

4. The device of claim 3 wherein the surface of said substrate is partially covered with a silicon dioxide layer, said silicon dioxide layer containing a large number of holes in mosaic arrangement, and containing said layer in said holes in contact with said substrate.

5. The device of claim 1 wherein said layer is on one side of said substrate and there is a transparent conductive layer on the other side of said substrate.

6. The device of claim 1 wherein said titanium oxide or said zirconium oxide is in an amount between 50 and 90 mole % of said mixture.

7. The device of claim 6 wherein said rare earth oxide is selected from the group consisting of yttrium oxide, europium oxide, dysprosium oxide, scandium oxide and samarium oxide, and wherein said compound is titanium oxide.

* * * * *

UNITED STATES PATENT OFFICE

CERTIFICATE OF CORRECTION

Patent No. 3670213 Dated June 13, 1972

Inventor(s) Takashi NAKAGAWA et al

It is certified that error appears in the above-identified patent and that said Letters Patent are hereby corrected as shown below:

On the first page of the Patent, left column, following the line specifying, "June 17, 1969 Japan........44/47325", insert the following line --June 23, 1969 Japan......44/48887--.

Signed and sealed this 26th day of December 1972.

(SEAL)
Attest:

EDWARD M.FLETCHER,JR.
Attesting Officer

ROBERT GOTTSCHALK
Commissioner of Patents

UNITED STATES PATENT OFFICE
CERTIFICATE OF CORRECTION

Patent No. 3,670,213 Dated June 13, 1972

Inventor(s) Takashi NAKAGAWA et al

It is certified that error appears in the above-identified patent and that said Letters Patent are hereby corrected as shown below:

Column 4, line 55, replace "on electrodes" with --one electrode--.

Signed and sealed this 12th day of June 1973.

(SEAL)
Attest:

EDWARD M.FLETCHER,JR.
Attesting Officer

ROBERT GOTTSCHALK
Commissioner of Patents